United States Patent [19]

Kato

[11] Patent Number: 4,855,802
[45] Date of Patent: Aug. 8, 1989

[54] CONTACT TYPE IMAGE SENSOR

[75] Inventor: Toshiaki Kato, Matsumoto, Japan

[73] Assignee: Fuji Electric Co., Ltd., Kawasaki, Japan

[21] Appl. No.: 111,520

[22] Filed: Oct. 20, 1987

[30] Foreign Application Priority Data

Oct. 20, 1986 [JP] Japan ................................ 61-249109
Oct. 29, 1986 [JP] Japan ................................ 61-257519

[51] Int. Cl.[4] ..................... H01L 27/14; H01L 31/00; H01L 29/04; H01L 29/12
[52] U.S. Cl. ........................................ 357/30; 357/58; 357/59; 250/578
[58] Field of Search .............. 357/24 LR, 30 K, 30 Q, 357/58, 59 D; 250/578

[56] References Cited

U.S. PATENT DOCUMENTS

| | | | |
|---|---|---|---|
| 4,549,088 | 10/1985 | Ozawa | 250/578 |
| 4,607,168 | 8/1986 | Oritsuki et al. | 250/578 |
| 4,665,008 | 5/1987 | Nishiura et al. | 250/578 |
| 4,672,221 | 6/1987 | Saito et al. | 250/578 |
| 4,679,089 | 7/1987 | Kato | 357/30 Q |
| 4,739,178 | 4/1988 | Nobue | 250/578 |
| 4,754,152 | 6/1988 | Hayama et al. | 250/578 |

Primary Examiner—Gene M. Munson
Attorney, Agent, or Firm—Brumbaugh, Graves, Donohue & Raymond

[57] ABSTRACT

Image sensors for use in facsimile machines and the like are formed in which an insulating film is interposed between the semiconductor film and the individual electrode contacts. When the image sensor is of the type having individual electrodes on the surface of an insulating substrate, and a common electrode on a surface of the semiconductor film away from the substrate, the insulating film is formed such that an opening exists over a consistent portion of each individual electrode through which the photoelectric conversion semiconductor film makes contact with the individual electrodes. The interposition of the insulating film keeps the semiconductor film from coming in contact directly with the insulating substrate, thus no impurity can diffuse from the substrate to the semiconductor film. Furthermore, satisfactory adhesion between the semiconductor film and the insulating film, and between the insulating film and the substrate, results in satisfactory adhesion between the semiconductor film and the substrate.

10 Claims, 5 Drawing Sheets

CONTACT TYPE IMAGE SENSOR

BACKGROUND OF THE INVENTION

The present invention relates to a contact-type image sensor with a multiplicity of photoelectric conversion elements disposed in an array, for example, a linear array. The sensor may be used in the reader of a facsimile device (telecopier), or in the image input unit of office automation equipment, a paper money discriminator, a hand scanner, or any of a number of other devices in which an image is to be converted to electrical signals.

When an image is to be sent from one facsimile device to another, the sending device must convert the image to electrical signals, which are transmitted to the receiving device where the image is recreated. It is well known to equip the sending device with a document reader over which the image is passed (or which passes over the image). The document reader is typically an image sensor with a multiplicity of photoelectric conversion elements disposed in one row. In a typical device, these elements may be spaced as closely as 8 elements per millimeter.

Each element responds to light and dark areas in one small portion of the image and thus the image is divided into picture elements, sometimes called "pixels" or "dots".

One example of a well-known type of image sensor is that shown in FIGS. 1(a) and 1(b). A multiplicity of chromium individual electrodes 1 having a connector 2 are formed on an insulating substrate 3 through photoetching; a photoelectric conversion semiconductor film 4 consisting of an intrinsic amorphous silicon (hereinafter called a-Si) is then grown through masking; and finally an ITO (indium-tin-oxide) common electrode 5 forming a hetero junction with the a-Si film 4 is provided through masking.

A second example of a well-known type of image sensor is that shown in FIG. 2. Using photoetching techniques, a multiplicity of conductors 6 and individual electrodes 1 are formed in an array on an insulating substrate 3. Connectors 2 make electrical contact between the conductors 6 and the individual electrodes 1. A connection 7 for attachment to a common electrode is formed on the insulating substrate 3. A semiconductor film 4 consisting of an a-Si film is then grown through masking. Finally an ITO common electrode 5 forming a hetero junction with the a-Si film 4 is provided through masking.

A third example of a well-known type of image sensor is that shown in FIG. 3. Using photoetching techniques, a multiplicity of individual electrodes 1 and connectors 2 are formed of chromium, and joined to wiring 6 which is formed of chromium-gold on the insulating substrate 3. A PIN junction semiconductor film 4 comprising a layer of a P-type hydrogenated amorphous silicon carbide (hereinafter called a-SiC), a layer of an intrinsic a-Si, and a layer of an N-type a-Si deposited in sequence is formed through masking. An ITO common electrode 5 is then formed through masking and finally a chromium douser film 8 is formed thereon through photoetching.

Each of these known image sensors suffers from certain drawbacks. For example, in the example of FIGS. 1(a) and 1(b), since the semiconductor film 4 is in direct contact with the substrate 3 at a plane 9, impurities are able to diffuse from the substrate through the plane to cause deterioration in the characteristics of the semiconductor film. For example, if glass is used as the substrate, impurities such as alkali metals, alkaline earth metals or the like which can alter the characteristics of the semiconductor may diffuse out of the glass. Hence there has heretofore been no alternative but to use an expensive ceramic for the insulating substrate 3, driving up the cost of the image sensor. Further, it is difficult to obtain a satisfactory adhesion between the semiconductor film 5 and the substrate 3, thus leading to a deterioration in reliability.

In the example of FIG. 2, since the common electrode 5 is formed through masking, some variation in the dimensions of the common electrode and its extent of overlap with the individual electrodes is unavoidable. This variation is shown as distance x in FIG. 2. These variations in dimensions gives rise to variations in the effective photoelectric conversion area, thus causing variations in photoelectric output. This turn causes a deterioration of image reading quality and yield.

Special manufacturing processes have been employed to minimize the variation x. These special processes are expensive, however, and thus not entirely acceptable.

Finally, in the example of FIG. 3, the chromium douser film 8, which establishes the pixel area, is formed through photoetching, and thus the lighting window defined by the film must be precisely positioned. For example, a sensor with 8 dots per millimeter has individual electrodes 1 that are 100 $\mu$m square and lighting windows established by the douser film 8 that are 60 to 100 $\mu$m square. In order for each lighting window to overlap completely with an individual electrode so that the effective photoelectric conversion areas are the same, the lighting window must be positioned with a precision of ±20 $\mu$m or better. In the case of a large-sized substrate for scanning a document with a width of several tens of centimeters, a precision of ±20 $\mu$m or better is very hard to obtain, and when photoetching the douser film 8, markers must be matched very strictly, using, for example, a microscope. This and other factors, such as dimensional variation due to contraction and expansion of the substrate, make the manufacturing process quite expensive.

It is therefore an object of the invention to provide a contact image sensor, which is free of the problems discussed in the context of FIGS. 1(a) and 1(b), such as deterioration in characteristics of the pixels due to diffusion of an impurity from the insulating substrate to the semiconductor film. Another object of the invention is to provide satisfactory adhesion between the semiconductor film and the substrate. Yet another object of the invention is, in the example of FIGS. 2 and 3, to provide a contact image sensor wherein the sensor may be manufactured through a simple process, and wherein the variability in photoelectric output of each pixel is minimized.

SUMMARY OF THE INVENTION

According to the invention, image sensors are formed in which an insulating film is interposed between the semiconductor film and the individual electrode contacts. When the image sensor is of the type having individual electrodes on the surface of an insulating substrate, and a common electrode on a surface of the semiconductor film away from the substrate, the insulating film is formed such that an opening exists over a consistent portion of each individual electrode through which the photoelectric conversion semiconductor film makes contact with the individual electrodes. The interposition of the insulating film keeps the semiconductor film from coming in contact directly with the insulating substrate, thus no impurity can diffuse from the substrate to the semiconductor film. Furthermore, satisfactory adhesion between the semiconductor film and the insulating film, and between the insulating film and the substrate, results in satisfactory adhesion between the semiconductor film and the substrate.

When the image sensor is of the type having a common electrode on the surface of an insulating substrate, and individual electrodes on a surface of a semiconductor film away from the substrate, the insulating film is formed so as to have an opening disposed over a consistent portion of the common electrode. The individual electrodes, which come in contact with the semiconductor layer through this opening in the insulating films accordingly also have an equal area, thus giving rise to a consistent response among the various pixels. When the invention is employed, the positions of the opening of the insulating films and the positions of the individual electrodes need not be so precisely controlled, and a simple process, such as end matching, proves to be accurate enough. Furthermore, to keep the output of a pixel from being influenced by an adjacent pixel, it is desirable that a portion of the semiconductor layer on the side coming in contact with the individual electrodes consist of a high resistance semiconductor film.

BRIEF DESCRIPTION OF THE DRAWINGS

FIG. 4 represents one embodiment of the invention, wherein

FIG. 5 represents an image sensor prepared as a comparative example, wherein

FIG. 7 represents a second embodiment of an image sensor according to the invention, wherein

FIG. 8 represents a third embodiment of an image sensor according to the invention, wherein

FIG. 11 represents a fourth embodiment of the invention, wherein

DETAILED DESCRIPTION OF THE INVENTION

Figure 1A:
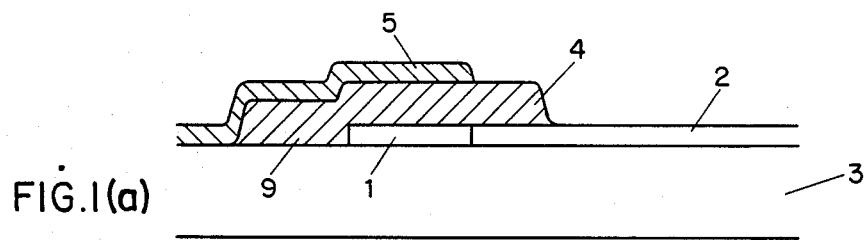
FIG. 1 represents a prior art image sensor, wherein (a) is a sectional view and (b) is a plan view.
Figure 1B:
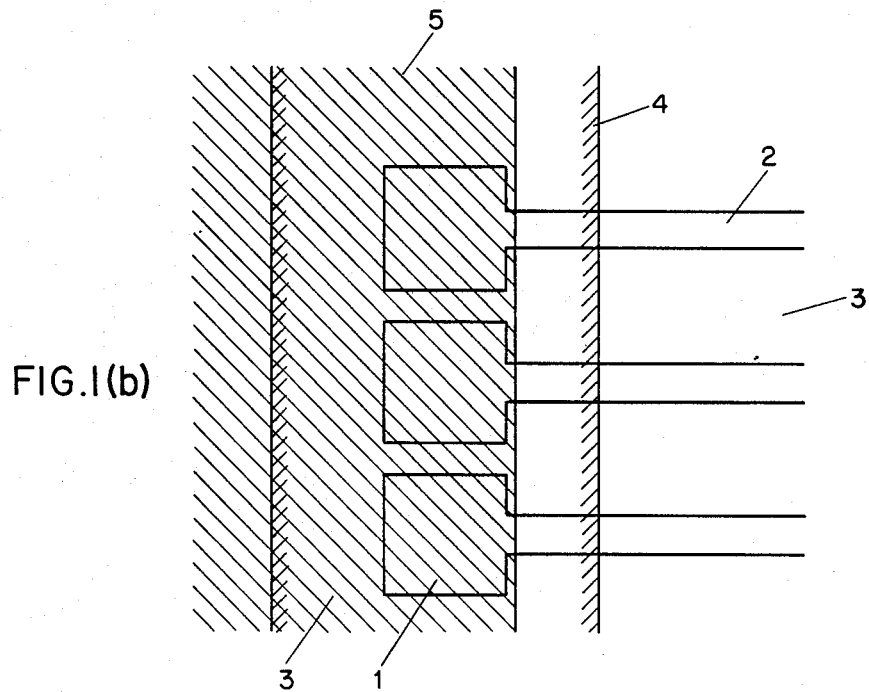
Figure 2:
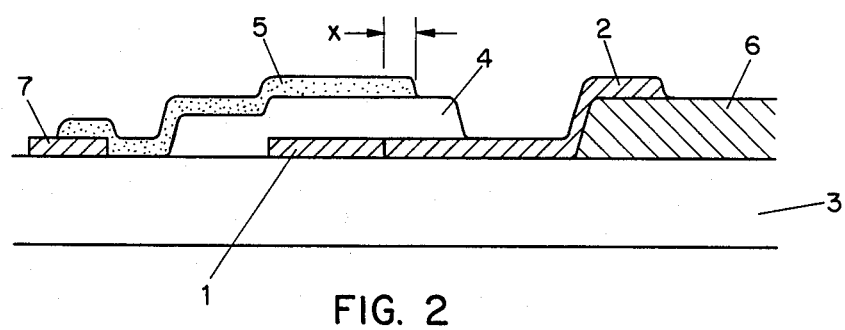
FIG. 2 is a sectional view of a second prior art practical example.
Figure 3:
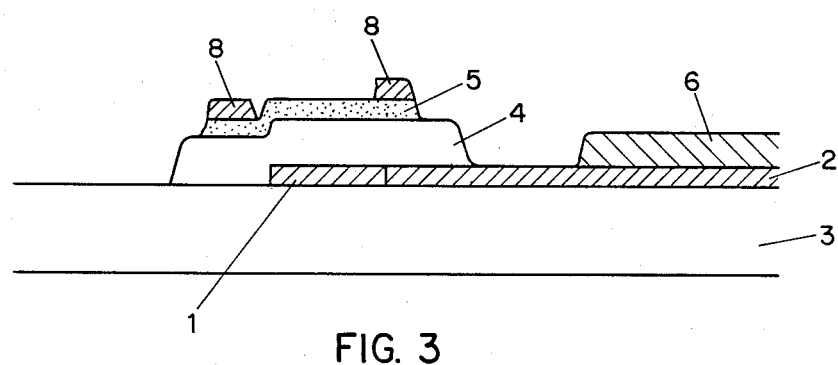
FIG. 3 is a sectional view of a third prior art practical example.

Embodiments of the invention will now be described with reference to FIGS. 4-12 with like reference numerals given to the parts common to FIGS. 1, 2, and 3.

Figure 4A:
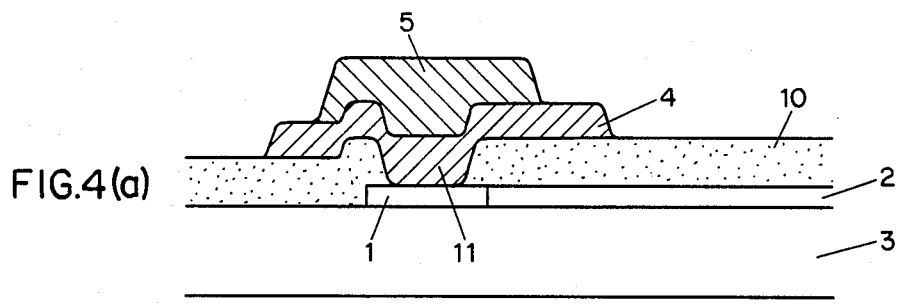
FIG. 4(a) is a sectional view and FIG. 4(b) is a plan view.
Figure 4B:
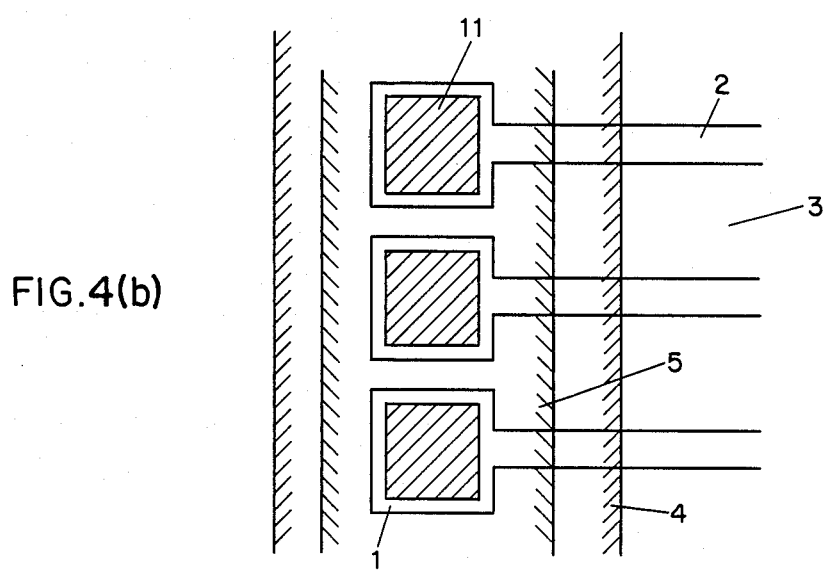

FIGS. 4(a) and 4(b) represent a first embodiment of the invention, wherein FIG. 4(a) is a sectional view and FIG. 4(b) is a plan view indicating a positional relation between both electrodes and an insulating film. The image sensor uses a soda lime glass substrate 3 as the insulating substrate having individual electrodes 1 and connectors 2 formed of ITO thereon. An insulating film 10 having a contact hole 11 indicated by oblique lines in FIG. 4(b) is formed of a photosensitive polyimide such as "PL-1200", a trade name of Hitachi Kasei. The entirety of each contact hole 11 is positioned over a part of the corresponding individual electrode 1.

The semiconductor film 4 is formed on the insulating layer 10 as follows, and extends through the contact holes 11 to make contact with the individual electrodes 1. First, a P-type a-SiC film 200Å thick is obtained through plasma glow electrolysis of a gas prepared by mixing silane ($SiH_4$), acetylene ($C_2H_2$), and diborane ($B_2H_6$) in the ratio of 1:0.05:0.001 which has been diluted with hydrogen ($H_2$). Next, an intrinsic a-Si film 5000Å thick is obtained through plasma glow electrolysis of silane gas diluted with hydrogen. Finally an N-type a-Si film 500Å thick is obtained through plasma glow electrolysis of a gas prepared by mixing silane and phosphine ($PH_3$) in the ratio of 1:0.01 and which has been diluted with hydrogen. Finally, common electrode 5 is provided through a screen printing of carbon paste such as "Dhotite FC-401", a trade name of Fujikura Kasei.

Figure 5A:
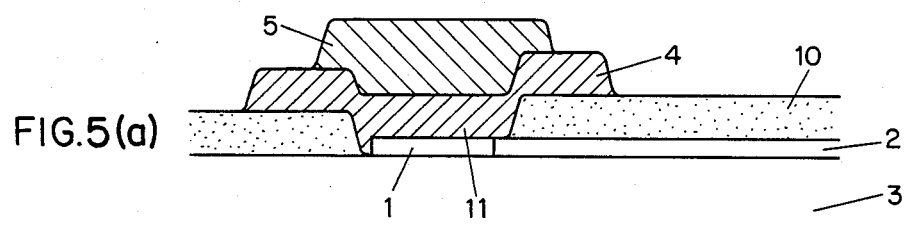
FIG. 5(a) is a sectional view and FIG. 5(b) is a plan view.
Figure 5B:
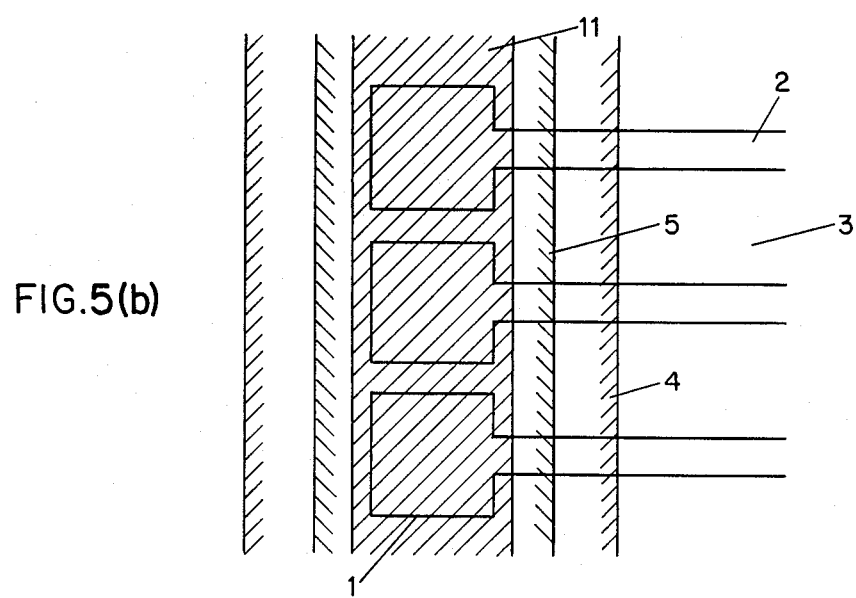

For comparison with a sensor made in accordance with FIG. 4 and the preceding description, a sensor structured as shown in FIG. 5(a) and FIG. 5(b) was produced and tested. Nothing is different from the sensor as shown in FIG. 4 except that the contact hole 11 in the insulating film 10 was larger and extended beyond the edge of the individual electrode 1, so as to permit the semiconductor film 4 to come in contact with the substrate 3. The pixels in both devices are the same in area, namely 100 μm square.

Figure 6:
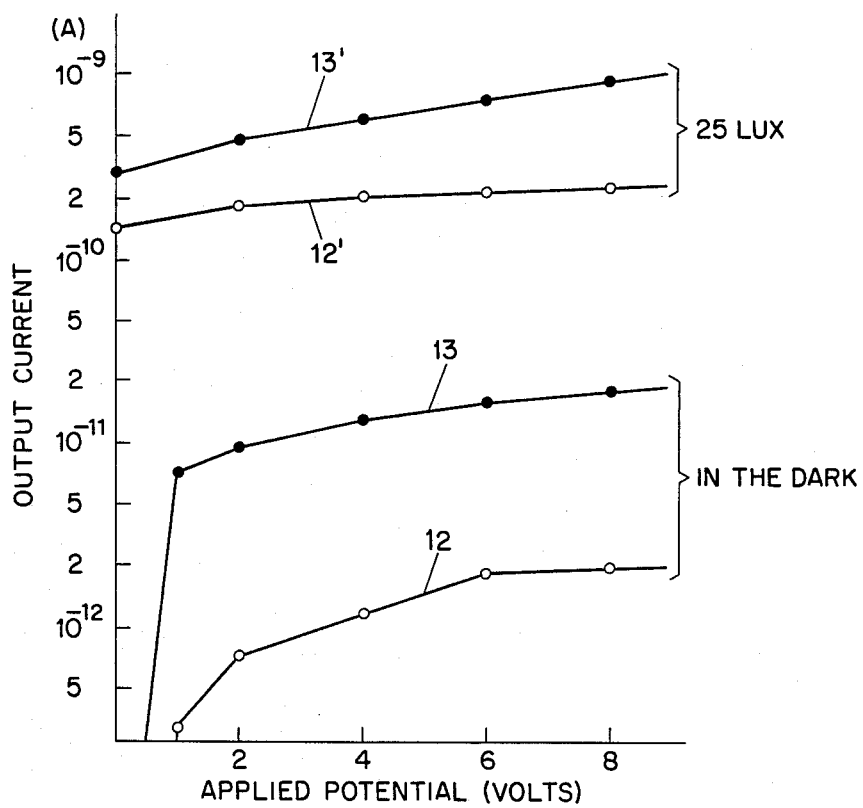
FIG. 6 is a voltage-current characteristic diagram of a photoelectric conversion element of the embodiments shown in FIGS. 4 and 5, in the light and in the dark.

FIG. 6 shows the current output of a pixel of the two sensors in a reverse biased condition in both the light and the dark. Lines 12 and 12' indicate the result when the embodiment of the invention shown in FIGS. 4(a) and 4(b) was tested, while lines 13 and 13' indicate the result when the comparative example of the type shown in FIG. 5 was tested. The dark current of the sensor according to the invention is approximately an order of magnitude less than that of the comparative example, while the current at 25 lux illumination for the sensor embodying the invention is approximately half, or less, than that for the comparative example. These observed differences in the response of the two sensors indicate that in the sensor embodying the invention, a pixel is less influenced by light impinging on adjacent pixels (which may reach the pixel peripherally) than in the comparative example.

An adhesion test was also carried out, by placing adhesive cellophane tape on the sensor and removing it. In the comparative example, a separation occurred at the surface where the glass between individual electrodes comes in contact with the semiconductor film. In the case of the sensor embodying the invention, however, no separation was observed.

When a high quality material such as quartz glass or "7059 glass," a trade name of Corning Glass Works, is used on the substrate, output current characteristics equivalent to those in the sensor embodying the invention are obtainable even in a sensor as shown in FIG. 5. These materials still failed to perform satisfactorily in the adhesion test, however, and removing cellophane tape resulted in a separation as described previously.

In the example according to FIG. 4 a-SiC film with a resistivity of $10^5$ $\Omega$-cm or better is used on the side of the semiconductor film 4 that comes in contact with the individual electrodes 1. Because of this high resistivity, there is no leakage current between adjacent individual electrodes 1, and no pixel is influenced by the signal of an adjacent pixel. This enhances the resolution. It will be understood, however, that the choice of semiconductor in contact with the individual electrode is not necessarily limited to an a-SiC film and that high resolution may be obtained by selection of any semiconductor having a high resistivity ($10^5$ $\Omega$-cm or higher).

Figure 7A:
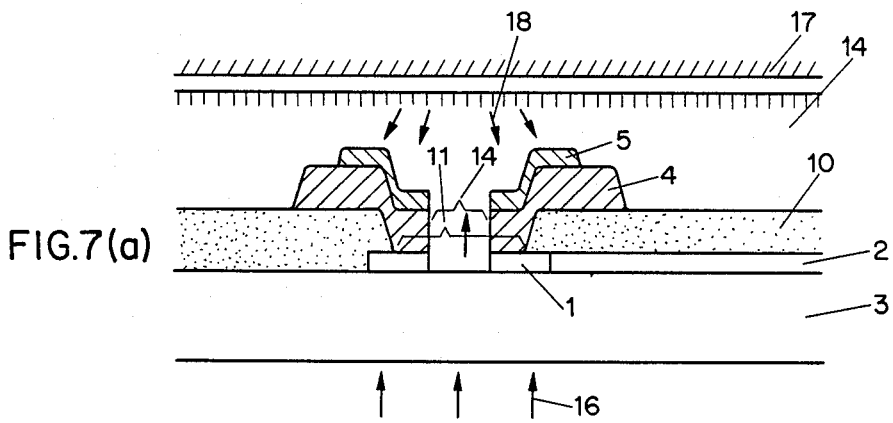
FIG. 7(a) is a sectional view and FIG. 7(b) is a plan view.
Figure 7B:
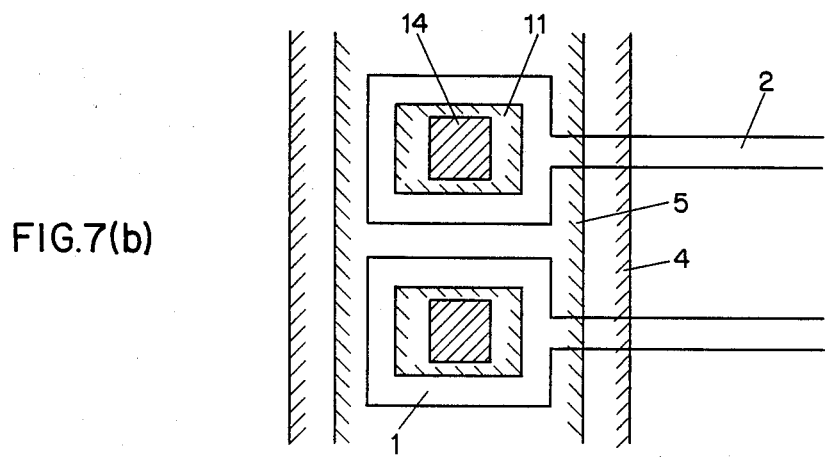

FIG. 7 represents a second embodiment of the invention, wherein FIG. 7(a) is a sectional view and FIG. 7(b) is a plan view. In this embodiment, the individual electrodes 1 and the connectors 2 are formed on a soda lime glass substrate 3 by photoetching a 1000Å chromium film. A polyimide film such as "PIX-8000X," a trade name of Hitachi Kasei, is applied 2 $\mu$m in thickness and burned in nitrogen at 180° C. for 30 minutes, at 300° C. for 30 minutes and further at 400° C. for 30 minutes to serve as the insulating film 10. A contact hole 11 is formed by photolithography over each individual electrode 1. Then the semiconductor film 4 is formed thereon which, as in the case of the first embodiment, comprises a high resistance P-type a-SiC film 200Å thick, an intrinsic a-Si film 1 $\mu$m thick and an N-type a-Si film 500Å thick. Next, the common electrode 5 is provided through mask evaporation of indium oxide. Lighting windows 14 are provided through all layers of the sensor by photoetching, and finally a clear guard resin 15 is applied by screen printing an acrylic coating agent to a thickness of 10 $\mu$m.

As shown in FIG. 7(a), the sensor is designed such that an illuminating light 16 coming from an elongated light source (for example, a light emitting diode array or fluorescent lamp) below the substrate is permitted to pass through the lighting windows 14 to reach a document 17 placed on the surface of the guard resin 15. Reflected and scattered light 18 srikes the semiconductor film 4 which is in contact with the individual electrodes 1 through the contact hole 11 of the insulating film 10. The light or dark quality of a pixel area of the document is converted to an electrical signal within the semiconductor film, and an individual electrode 1 collects the signal for that pixel.

The sensor of the second embodiment proves to have voltage-current characteristics similar to those of the first embodiment. Any substrate that is transmissive and insulating may be used. The sensor of the second embodiment does not require a self-focusing lens for imaging the document on the sensor as does the sensor of the first embodiment, and the prior art devices discussed above. Rather, the second embodiment permits the original document to be placed in direct contact with the sensor, reducing the cost of the product employing the sensor.

Figure 8A:
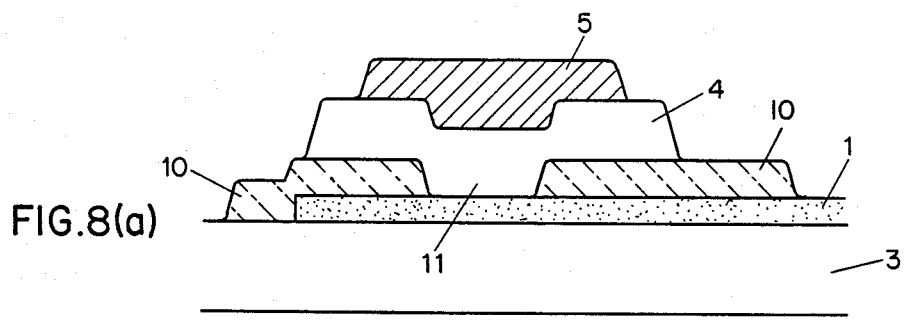
FIG. 8(a) is a sectional view and FIG. 8(b) is a plan view.
Figure 8B:
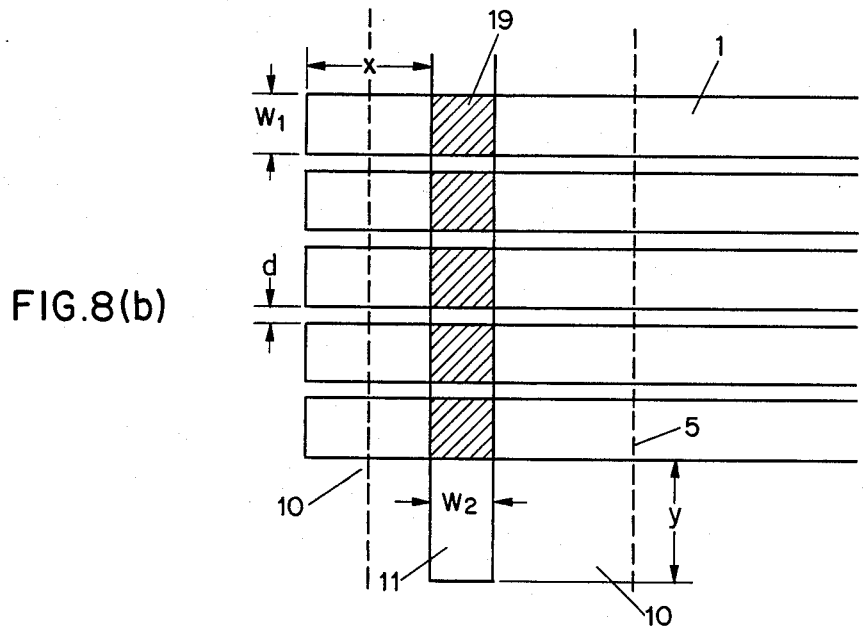

FIGS. 8(a) and 8(b) represent a third embodiment of the invention, wherein FIG. 8(a) is a sectional view and FIG. 8(b) is a plan view showing a positional relation between the electrodes and the insulating film. Individual electrodes 1 made of clear ITO films are, for example, 100 $\mu$m in width (shown as width $W_1$) each and are laid out in parallel at intervals d of 25 $\mu$m, for example, as shown in FIG. 8(b). An insulating film 10 is formed over the individual electrodes 1 having an opening 11 of width $W_2$, for example 100 $\mu$m. The opening 11 is arranged perpendicular to the individual electrodes 1. Semiconductor film 4 is then deposited thereon and makes contact with the individual electrodes 1 at a region 19 of the opening 11 indicated by oblique lines in FIG. 8(b) where the opening 11 and the individual electrodes intersect. Finally, common electrode 5 is formed as indicated by dotted lines in FIG. 8(b), so as to at least cover the opening 11.

An image sensor comprising an array of elements as shown in FIG. 8 was manufactured through the following process. First, a group of 1,728 individual electrodes 1, each 100 $\mu$m in width, spaced from each other by 25 $\mu$m, were formed on the glass substrate 3 from ITO films through photoetching. Next, the insulating films 10 were obtained by depositing a sensitive polyimide, for example "PL-1200," a trademark of Hitachi Kasei, and the opening 11 of 100 $\mu$m in width was formed by means of a mask aligned through end pin matching. Then, the semiconductor film 4 was formed by means of a mask, by accumulating: a high resistance P-type a-SiC film 200Å thick by means of a plasma glow electrolysis of a gas prepared by mixing $SiH_4$, $C_2H_2$, and $B_2H_6$ in the ratio of 1:0.06:0.00075; then an intrinsic a-Si film 5,000Å thick by means of a plasma glow electrolysis of a gas prepared by mixing $SiH_4$ and $PH_3$ in the ratio of 1:10; and further an N-type a-Si film 500Å thick by mean of a plasma glow electrolysis of a gas prepared by mixing $SiH_4$ and $PH_3$ in the ratio of 1:0.01. Lastly, the common electrode 5 was formed 1 mm in width thereon through a screen printing of carbon paste, for example "Dhotite FC-401P," a trademark of Fujikura Kasei. Dimensions indicated by x and y in FIG. 8(b) are designed to 300 $\mu$m each.

Figure 9:
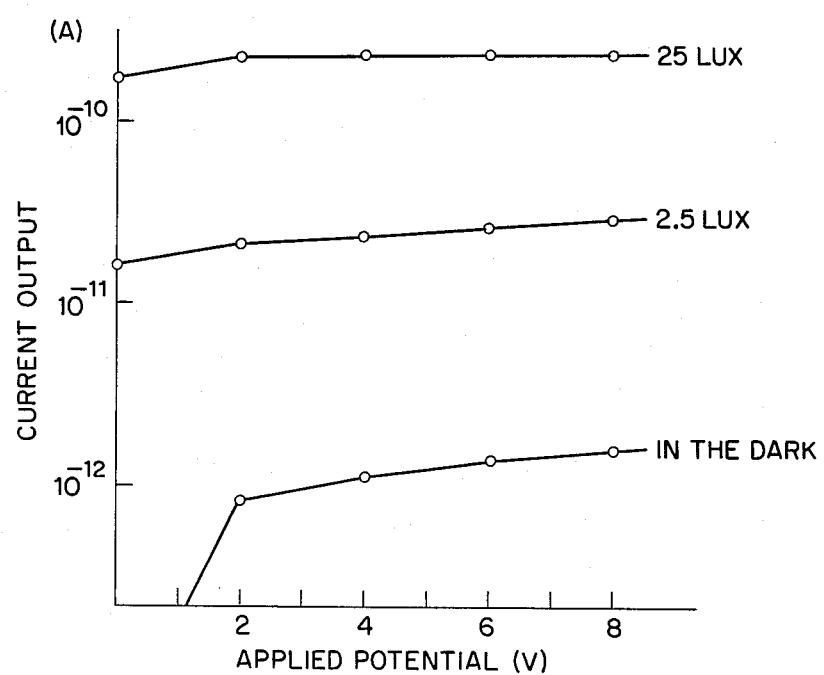
FIG. 9 is a voltage-current characteristic diagram of the image sensor of FIG. 8, in the light and in the dark.

Five hundred image sensors of this type were manufactured and tested to determine the variability in the characteristics of the product. The dimension x was found to be 300 $\mu$m$\pm$40 $\mu$m, while y was 300 $\mu$m$\pm$43 $\mu$m. The voltage-current characteristic of the elements was measured and found to be typified by that shown in FIG. 9, showing output currents when a reverse-bias voltage was applied at 25 lux, 2.5 lux and in the dark.

To determine the variability of individual picture elements, a study was made of the voltage-current characteristics of 1,728 pixels. Measurements of the output currents of these pixels at 25 lux and a voltage of 3V revealed an average variation of $-6.4\%$.

Figure 10:
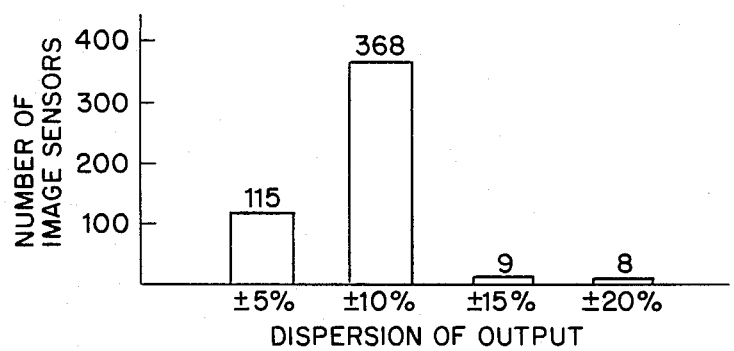
FIG. 10 is a frequency distribution diagram of element output in a sensor of the embodiment shown in FIG. 8.

A study was then made of the variability of individual pixels of each of the 500 sensors, with the results shown in FIG. 10. All of the 500 sensors exhibited element outputs varying by less than 20%, while 483 pieces (96.6%) came within $\pm 10\%$.

Figure 11A:
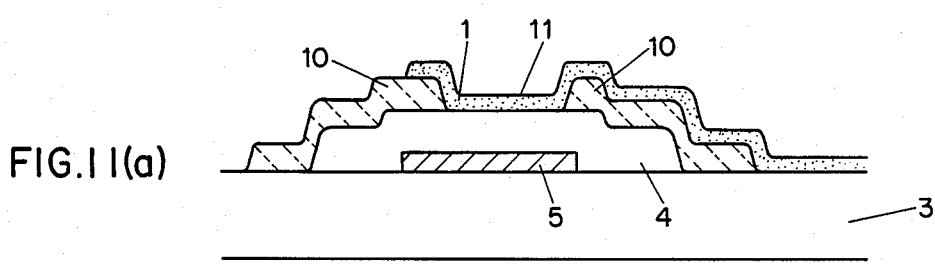
FIG. 11(a) is a sectional view and FIG. 11(b) is a plan view.
Figure 11B:
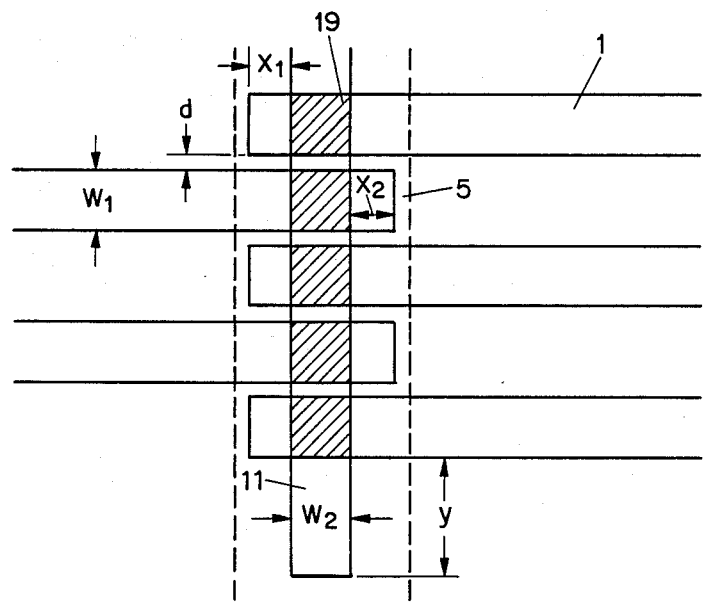
Figure 12:
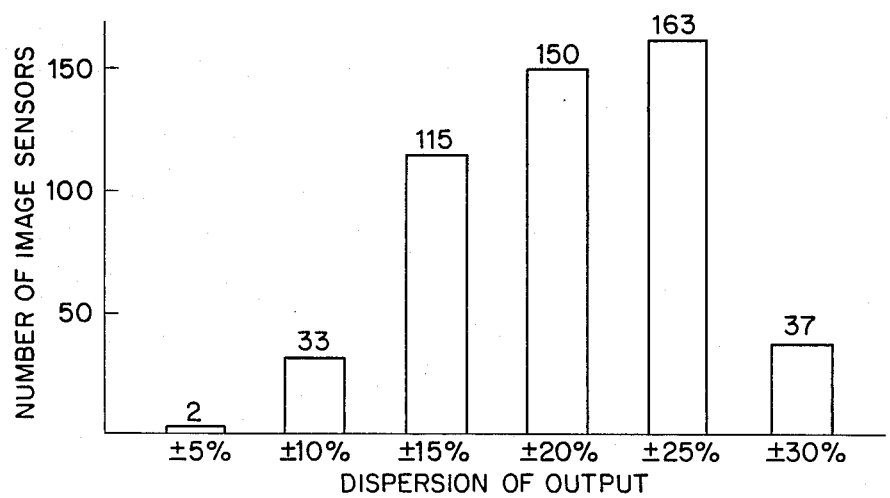
FIG. 12 is a frequency distribution diagram of element output in a sensor of the embodiment given in FIG. 11.

FIGS. 11(a) and 11(b) represent a fourth embodiment of the invention, wherein FIG. 11(a) is a sectional view and FIG. 11(b) is a plan view. Common electrode 5, consisting for example of chromium, is provided on the glass substrate 3 as indicated by dotted lines in FIG. 11(b). A semiconductor film 4 is formed next, followed by insulating films 10 having the opening 11. A plurality of individual electrodes 1, for example of ITO film, are formed over the insulating film oriented perpendicularly to the direction of the opening 11, in contact with the semiconductor layer 4 through the opening 11 to form a hetero junction therewith. In this embodiment, first the common electrode 5 is formed of chromium on the glass substrate 3 through masking, then the intrinsic a-Si film 4 1 μm in thickness is formed thereon through masking by means of a plasma glow electrolysis of a gas prepared by mixing $SiH_4$ and $H_2$. Then the insulating film 10 having opening 11 $W_2$ in width are formed through photoetching. $W_2$ is, for example, 100 μm. Next, the individual electrodes 1 are formed through sputtering and wrought through photoetching by means of a mask which was positioned by pin matching, yielding the 1,728 individual electodes 1, each of which is 100 μm wide (shown as $W_2$) and separated by 25 μm (shown as d). The electrodes are laid out extending alternately to one side and to the other. The distances $X_1$ and $X_2$ as shown in FIG. 11(b) were designed to be 100 μm, while the distance y was designed to be 200 μm.

Five hundred prototype sensors as shown in FIG. 11 were prepared, and the actual dimensions $X_1$, $X_2$, and y were measured. The variation of dimensions of $X_1$, $X_2$ was 100 μm±42 μm and that of y was 200 μm±48 μm. Then, each of the 500 sensors was subjected to a measurement of current outputs across all 1,728 pixels at intensity of 25 lux with an applied voltage of 5 V to determine the variability of element output in any one sensor, and the distribution shown in FIG. 12 was obtained. All the sensors came within ±30%.

As can be seen from the foregoing examples, image sensors embodying the invention enjoy the advantage that the semiconductor layer is not degraded by migration of impurities such as alkali metal, alkaline earth metal or the like from the substrate. Thus, an image sensor of a moderate cost and high resolution is obtained, which is free from deterioration in reliability due to an insufficient tightness between the substrate and the semiconductor film. Furthermore, the semiconductor film can be adhered firmly onto the substrate through the insulating film interposed therebetween.

Moreover, image sensors according to the invention can be made using less precise and therefore less expensive techniques and yet achieve good levels of consistency in the effective photoelectric conversion area. This can be accomplished using a common electrode rough in both dimensional and positional precision which is in contact with one side of a semiconductor layer, and individual electrodes with a constant width which are built up on the other side and contact the semiconductor layer through insulating films. The contact regions are equal in area due to the constant width of opening in the insulating films, thus making possible an image sensor enjoying minimal variation in photoelectric output.

I claim:

1. An image sensor, comprising: a substrate and a plurality of individual picture elements disposed in a linear array thereon, each picture element comprising;
   an individual electrode;
   an insulating film disposed on a first surface of the individual electrode and extending beyond an edge of the individual electrode, said insulating film having an opening therein such that a central portion of the individual electrode remains uncovered by the insulating film;
   a semiconductor film with a first side and a second side, disposed on the insulating film and extending through the opening therein, so as to contact the individual electrode through the opening on its first side; and
   a portion of a common electrode disposed on the second side of the semiconductor film, so as to contact the semiconductor film in an area coincident with the area of contact between the semiconductor film and the individual electrode, wherein the picture elements are disposed on the substrate such that a portion of the insulating film that extends beyond the individual electrode is in contact with the substrate, the openings through the insulating film in each picture elements are of substantially equal area, and the portions of the common electrode are joined to form a single common electrode.

2. The image sensor of claim 1, wherein:
   the substrate permits the passage of light;
   each of the individual electrodes, and the semiconductor film, and the common electrode, are disposed so as to provide a window through each individual picture element which allows the passage of light through the substrate and through the window;
   and further comprising a clear guard layer disposed over the picture elements on a side opposite to the substrate.

3. An image sensor according to claim 1, wherein said insulating films of each picture element form a continuous insulating layer having a plurality of openings of substantially equal area arranged over said individual electrodes such that each of said openings is coincident with the central portion of one of the individual electrodes.

4. An image sensor according to claim 1, wherein said insulating films of each picture element form a continuous insulating layer having a single slot-like opening extending along the array of picture elements.

5. An image sensor according to claim 1, wherein the semiconductor film comprises a plurality of layers, including a high resistivity layer which contacts the individual electrode.

6. An image sensor according to claim 5, wherein the high resistivity layer has a resistivity of at least about $10^5$ Ω-cm.

7. An image sensor according to claim 5, wherein the semiconductor film comprises a PIN junction.

8. An image sensor according to claim 6, wherein the high resistivity layer is P-type amorphous silicon carbide.

9. An image sensor according to claim 7, wherein the high resistivity layer is P-type amorphous silicon carbide.

10. An image sensor according to claim 1, wherein the insulating film is disposed so as to prevent direct contact between the semiconductor film and the substrate.

* * * * *